(12) United States Patent
Greene et al.

(10) Patent No.: US 10,361,702 B2
(45) Date of Patent: Jul. 23, 2019

(54) FPGA MATH BLOCK WITH DEDICATED CONNECTIONS

(71) Applicant: Microsemi SoC Corp., San Jose, CA (US)

(72) Inventors: Jonathan W. Greene, Palo Alto, CA (US); Fei Li, San Jose, CA (US)

(73) Assignee: Microsemi SoC Corp., San Jose, CA (US)

(*) Notice: Subject to any disclaimer, the term of this patent is extended or adjusted under 35 U.S.C. 154(b) by 0 days.

(21) Appl. No.: 16/177,244

(22) Filed: Oct. 31, 2018

(65) Prior Publication Data

US 2019/0190522 A1    Jun. 20, 2019

Related U.S. Application Data

(60) Provisional application No. 62/598,753, filed on Dec. 14, 2017.

(51) Int. Cl.
*H03K 19/177* (2006.01)
*G06F 7/544* (2006.01)

(52) U.S. Cl.
CPC ....... *H03K 19/17728* (2013.01); *G06F 7/544* (2013.01); *H03K 19/17736* (2013.01)

(58) Field of Classification Search
CPC .............. G06F 7/544; H03K 19/17728; H03K 19/17736
See application file for complete search history.

(56) References Cited

U.S. PATENT DOCUMENTS

| | | | |
|---|---|---|---|
| 6,781,408 B1* | 8/2004 | Langhammer ... | H03K 19/17732 326/38 |
| 2012/0068229 A1* | 3/2012 | Bemanian ................ | G11C 5/04 257/209 |
| 2012/0319730 A1* | 12/2012 | Fitton ............ | H03K 19/017581 326/41 |

OTHER PUBLICATIONS

Peter Andrew Jamieson, Member, IEEE, and Jonathan Rose, Member, IEEE; Enhancing the Area Efficiency of FPGAs With Hard Circuits Using Shadow Clusters; IEEE Transactions on Very Large Scale Integration (VLSI) Systems, vol. 18, No. 12, Dec. 2010 (Year: 2010).*
"Intel® Arria® 10 Native Fixed Point DSP IP Core User Guide", Intel Corporation, Mar. 13, 2017.
"LatticeECP4 DSP Slice Architecture", White Paper, Lattice Semiconductor, Hillsboro Oregon, Nov. 2011.
(Continued)

*Primary Examiner* — Alexander H Taningco
*Assistant Examiner* — Kurtis R Bahr
(74) *Attorney, Agent, or Firm* — Glass and Associates; Kenneth D'Alessandro; Kenneth Glass (57) ABSTRACT

An architecture in a user-programmable integrated circuit includes a hard logic block having inputs and outputs, a first group of user-configurable general-purpose routing resources coupled to first selected ones of the inputs of the hard logic block, a soft logic block having inputs and outputs, first selected ones of the inputs of the soft logic block coupled to the first group of user-configurable general-purpose routing resources, first selected ones of the outputs of the soft logic block having dedicated connections to second selected ones of the inputs to the hard logic block, and a second group of user-configurable general-purpose routing resources coupled to second selected ones of the outputs of the soft logic block and to first selected ones of the outputs of the hard logic block.

9 Claims, 3 Drawing Sheets

(56) References Cited

OTHER PUBLICATIONS

"UltraScale Architecture DSP Slice User Guide", Xilinx Corporation, (v1.4) Jun. 1, 2017.
Peter, et al., "Enhancing the Area Efficiency of FPGAs With Hard Circuits Using Shadow Clusters", IEEE Transactions on Very Large Scale Integration (VLSI) Systems, vol. 18, No. 12, Dec. 2010.

* cited by examiner

FPGA MATH BLOCK WITH DEDICATED CONNECTIONS

BACKGROUND

The present invention relates to integrated circuit technology. More particularly, the present invention relates to logic blocks for integrated circuits, logic blocks for programmable integrated circuits, and particularly math blocks including both hard and soft logic. A math block is a circuit for computing mathematical operations, such as addition or multiplication.

Existing FPGA math blocks in field programmable gate array (FPGA) integrated circuits are composed exclusively of hard logic. While such math blocks may be somewhat configurable (for example, registers may be bypassed or multiplexers may be set to select one of two or more inputs), they cannot be used for general purposes to implement non-math portions of a target application.

FPGAs include "soft" logic which is general-purpose and highly programmable. Soft logic is usually composed of flip-flops and lookup tables (LUTs). Sometimes it also includes carry lookahead circuitry or simple gates such as AND gates, OR gates or multiplexers. Modern FPGAs usually also include "hard" logic that has a specific purpose and implements a fixed function, such as math or RAM block. The fixed function performed by these hard logic blocks may have a limited number of programmable operating modes.

Hard logic blocks obviously require connections to the general-purpose programmable routing. These connections allow the block inputs to receive signals from any portion of the soft logic anywhere in the chip, and the block outputs to drive any portion of the soft logic anywhere in the chip.

The hard logic is typically implemented using a standard cell library and/or custom layout. It is highly specialized to implement certain functions, and is of very limited or no use for other purposes. On the other hand, the soft logic is general purpose, and is useful to implement most any portion of the target application. However, when the hard logic can be used it is much more efficient in area, speed, and power than implementing the equivalent function in soft logic.

Three non-exhaustive examples of existing FPGA "hard" math blocks include the UltraScale+ Math Block in products including the DSP48E2 marketed by Xilinx, Inc., the Arria® 10 math block available from Intel, and a math block included in the ECP4 DSP Slice Architecture marketed by Lattice Semiconductor, and the math blocks provided in the RTAXD, SmartFusion2 and RTG4 FPGA families marketed by Microsemi. A prior art math block typically includes one or two multipliers, zero or more adders, and registers. The registers usually may be configured to be bypassed or not. The math block usually also includes multiplexers that may be configured to select one of their input busses. In addition to the inputs and outputs that connect the math block to the programmable routing, the math blocks have dedicated connections to adjacent math blocks that are not accessible to the general-purpose programmable routing.

As with all "hard" logic blocks, the math block function is largely fixed and special purpose, with only limited configurability. It supports a limited range of math operations, and is not usable for general purposes to implement non-math portions of a target application. When a hard block is not used, the area it occupies and the static power it consumes are wasted. Furthermore, the portion of the capacity of the general-purpose routing network that supports the inputs and outputs of the block is wasted.

Figure 1:
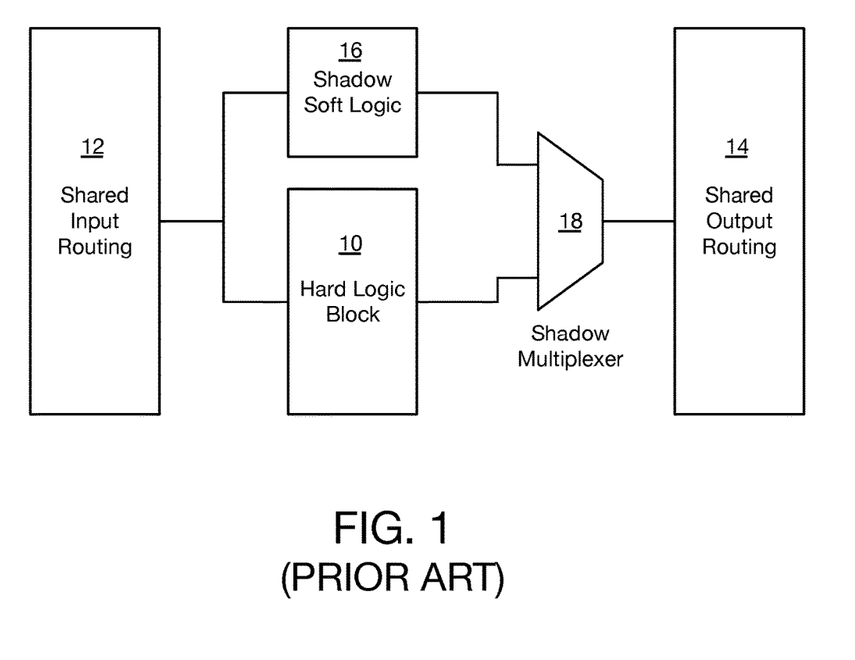
FIG. 1 is a block diagram illustrating a prior-art hard logic block coupled to shared input routing resources and shared output routing resources having in parallel shadow soft logic.

A way to reclaim some value from this unused routing capacity is described in Peter Jamieson and Jonathan Rose, IEEE Transactions On Very Large Scale Integration (VLSI) Systems, VOL. 18, No. 12, December 2010. The authors propose an architecture in which the connections to the programmable routing used for a hard logic block (such as a math block) are shared with some soft logic, which they call "shadow" logic. Such an architecture is shown in FIG. 1 in which a hard logic block 10 is shown coupled to shared input routing resources 12 and shared output routing resources 14. Shadow soft logic 16 is also coupled to the shared input routing 12. The outputs of the hard logic block 10 and the shadow soft logic 16 are coupled to the shared output routing resources 14 through a shadow multiplexer 18. The idea is that if the hard logic block 10 is not used, the shadow soft logic 16 can be used for general purposes instead by using shadow multiplexer 18 to connect the output of shadow soft logic 16, instead of the output of hard logic block 10, to the shared output routing resources 14. This avoids wasting the scarce and expensive programmable routing capacity of the shared input and output routing resources 12 and 14 required to service the hard logic block 10. However, in this approach the use of the shadow soft logic 16 and the hard logic block 10 is mutually exclusive. If the hard logic block 10 is used, the shadow soft logic 16 is unselected by the multiplexer 18, cannot be used, and thus is wasted.

Over time, hard math blocks have become more complex. Besides the basic functionality of a multiplier and final adder/accumulator, they may require supplementary functionality such as a pre-adder, register chains, additional multiplexers (such as in the "booster logic" of the ECP4 DSP Lattice block) or even small RAMs to store coefficient values (as in the Intel Arria® 10 math block). This supplementary functionality is needed in some but not all modes of operation of the math block. In the prior art, this supplementary functionality is provided by adding additional hard logic circuitry to the math block. However if the math block is not used, or if the math block is used but in a mode that does not require the supplementary functionality, the area occupied by the additional hard circuitry and the static power it consumes are wasted.

In theory, it would be possible to implement the supplementary functionality using soft logic. However this is problematic. Since the connections between the soft and hard logic go through the general-purpose routing, they may have varying delays that are slow and difficult to predict. This make it difficult to ensure that the combination of the basic and supplementary functionality operates at the necessary speed.

Thus, it would be desirable to (a) get some value from the shadow soft logic even when the hard block is used, and/or (b) provide the supplementary functionality that may be needed for certain modes of the hard block in a more efficient way than providing additional hard logic circuitry.

BRIEF DESCRIPTION

According to one aspect of the present invention, an architecture in a user-programmable integrated circuit includes a hard logic block having inputs and outputs, a first group of user-configurable general-purpose routing resources coupled to first selected ones of the inputs of the hard logic block, a soft logic block having inputs and outputs, first selected ones of the inputs of the soft logic block coupled to the first group of user-configurable general-purpose routing resources, first selected ones of the outputs of the soft logic block having dedicated connections to second selected ones of the inputs to the hard logic block, and a second group of user-configurable general-purpose routing resources coupled to second selected ones of the outputs of the soft logic block and to first selected ones of the outputs of the hard logic block.

According to another aspect of the present invention, second selected ones of the inputs of the soft logic block are selectively coupled to one of the first group of user-configurable general-purpose routing resources and by dedicated connections to second selected ones of the outputs of the hard logic block.

According to another aspect of the invention, the second selected ones of the inputs of the soft logic block are selectively coupled to the one of the first group of user-configurable general-purpose routing resources and by the dedicated connections to the second selected ones of the outputs of the hard logic block through a routing multiplexer having a select input driven by a programmable memory cell.

According to another aspect of the present invention, an architecture in a user-programmable integrated circuit includes a hard logic block having inputs and outputs, a first group of user-configurable general-purpose routing resources coupled to first selected ones of the inputs of the hard logic block, a shadow soft logic block having inputs and outputs, first selected ones of the inputs of the shadow soft logic coupled to the first group of user-configurable general-purpose routing resources and to the first selected ones of the inputs of the hard logic block, first selected ones of the outputs of the shadow soft logic block coupled by dedicated connections to second selected ones of the inputs to the hard logic block, a second group of user-configurable general-purpose routing resources coupled to first selected ones of the outputs of the hard logic block, and a shadow multiplexer having first data inputs, second data inputs, a select input, and data outputs, the first data inputs of the shadow multiplexer coupled to second selected ones of the outputs of the shadow soft logic block, the second data inputs of the shadow multiplexer coupled to second selected ones of the outputs of the hard logic block, the data outputs of the shadow multiplexer connected to the second group user-configurable general-purpose routing resources, and the select input of the shadow multiplexer driven by a programmable memory cell.

According to another aspect of the present invention, second selected ones of the inputs of the shadow soft logic block are selectively coupled to one of the first group of user-configurable general-purpose routing resources and by dedicated connections to third selected ones of the outputs of the hard logic block.

According to another aspect of the present invention, the second selected ones of the inputs of the shadow soft logic block are selectively coupled to the one of the first group of user-configurable general-purpose routing resources and by the dedicated connections to the third selected ones of the outputs of the hard logic block through a routing multiplexer having a select input driven by a programmable memory cell.

According to another aspect of the present invention, a soft logic block has inputs and outputs, first selected ones of the inputs of the soft logic block coupled to the first group of user-configurable general-purpose routing resources, first selected ones of the outputs of the soft logic block having dedicated connections to third selected ones of the inputs to the hard logic block, and second selected ones of the outputs of the soft logic block are coupled to the second group of user-configurable general-purpose routing resources.

According to another aspect of the present invention, second ones of the inputs of the soft logic block are selectively coupled to one of the first group of user-configurable general-purpose routing resources and by dedicated connections to the third selected outputs of the hard logic block.

According to another aspect of the present invention, the second ones of the inputs of the soft logic block are selectively coupled to the one of the first group of user-configurable general-purpose routing resources and by the dedicated connections to the third selected outputs of the hard logic block through a routing multiplexer having a select input driven by a programmable memory cell.

BRIEF DESCRIPTION OF THE DRAWING FIGURES

The invention will be explained in more detail in the following with reference to embodiments and to the drawing in which are shown.

DETAILED DESCRIPTION

Persons of ordinary skill in the art will realize that the following description of the present invention is illustrative only and not in any way limiting. Other embodiments of the invention will readily suggest themselves to such skilled persons.

Figure 2:
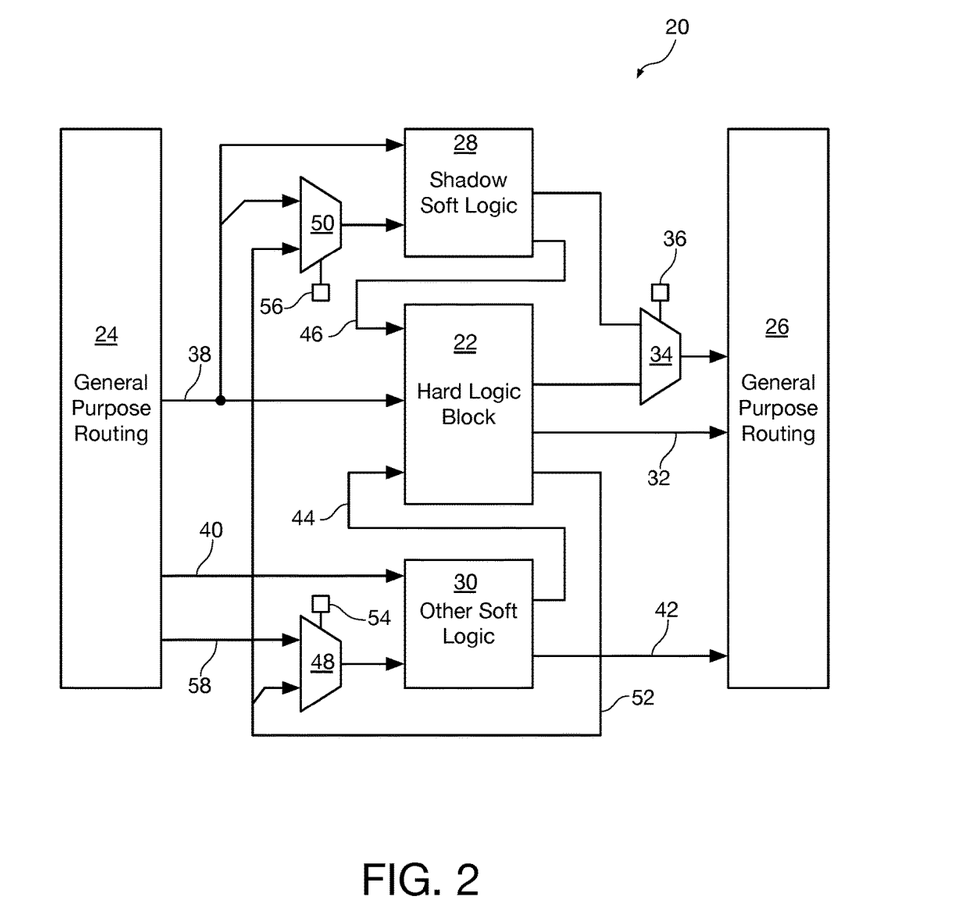
FIG. 2 is a block diagram illustrating a hard logic block coupled to general-purpose routing resources and also to shadow soft logic and other soft logic in accordance with one aspect of the present invention.

Referring now to FIG. 2, a block diagram shows a non-limiting example of an architecture 20 embodying the invention, for use in an FPGA. Architecture 20 includes hard logic block 22 which may be, as a non-limiting example, a math block. A portion 24 of the user-configurable general-purpose routing provides inputs to the soft and hard logic. Another portion 26 of the general-purpose routing receives outputs from the soft and hard logic. Two groups of soft logic are associated with hard logic block 22. Shadow soft logic 28 is (as in the prior art) soft logic that shares connections to the general-purpose routing 24 and 26 with the hard logic block 22. For this reason, the shadow soft logic 28 can be used for general-purposes only if the hard logic block 22 is not employed in the user design. Other soft logic 30 is soft logic that (unlike shadow soft logic) can be used for general-purposes even if the hard logic block 22 is used. This is because the other soft logic 30 has its own connections to the general-purpose routing 24 and 26, not shared with the connections between the hard logic block 22 and the general-purpose routing 24 and 26. Typically the architecture includes many instances of a hard logic block, each with its own associated soft logic, all connected to the same general-purpose routing network. FIG. 2 shows just one instance as an example.

As will be appreciated by persons of ordinary skill in the art, general-purpose routing 24 and 26 are formed from programmable interconnect conductors and programmable interconnect elements (such as switches or multiplexers and possibly also including inverting or non-inverting buffers). Such programmable interconnect conductors and programmable interconnect elements are well known and will not be described herein in order not to overcomplicate the disclosure and unintentionally obscure the invention.

The hard logic block 22 receives input from the general-purpose routing resources 24 and provides output to the general-purpose routing resources 26. Some of the input connections may be unique to the hard logic block 22 and others shared with the shadow soft logic 28. Some of the output connections from hard logic block 22 may go directly to the general-purpose routing 26 through connections 32, and others are coupled through a shadow multiplexer 34, with the output of shadow multiplexer 34 coupled to the general-purpose routing resources 26. The select input of the shadow multiplexer 34 is driven from a programmable memory cell 36 and is configured by the contents of the programmable memory cell 36 to pass either signals from shadow soft logic 28 or from hard logic block 22 at the time the user circuit is programmed into the integrated circuit containing the architecture 20.

Shadow soft logic 28 receives input from the general-purpose routing resources 24 via connections 38, which are shared with the hard logic block 22. When the hard logic block 22 is in use, outputs from the hard logic block 22 are routed to the general-purpose routing resources 26 through shadow multiplexer 34. When the hard logic block 22 is not in use, the outputs of the shadow soft logic 28 are routed to the general-purpose routing resources 26 through shadow multiplexer 34, and the shadow soft logic 28 can be used for general purposes. The select input of the shadow multiplexer 34 is set during device programming after it is determined whether the hard logic block 22 will be employed in the user design.

Other soft logic 30 receives inputs from the general-purpose routing resources 24 directly through connections 40. Other soft logic 30 provides outputs to the general-purpose routing resources 26 directly through connections 42. Since these connections 42 are not shared with the hard logic block 22, the other soft logic 30 can be used for general-purposes even when the hard logic block 22 is being used in the user design.

Embodiments herein enable the use of some, or all, of the shadow soft logic 28 or other soft logic 30 to provide the supplementary functionality that may be required when the hard logic block 22 is used in certain modes. To make this possible, dedicated connections 44 and 46 may be provided from certain outputs (e.g., LUT or flip-flop outputs) of the other soft logic 30 and the shadow soft logic 28, respectively, to certain inputs of the hard logic block 22. In addition, routing multiplexers 48 and 50 are introduced so that certain inputs of the other soft logic 30 or the shadow soft logic 28 (e.g., LUT or flip-flop inputs) normally driven by connections 38, or 58 from the general-purpose routing 24 can instead be driven by certain outputs of the hard logic block 22 using dedicated connections 52 when the soft logic 28 or 30 is used to implement supplementary functionality.

Multiplexer 48 is controlled by configuration memory cell 54 and allows other soft logic 30 to be driven by either outputs 58 from the general-purpose routing 24 or by certain outputs of the hard logic block 22 using dedicated connections 52 when the soft logic 30 is used to implement supplementary functionality.

Multiplexer 50 is controlled by configuration memory cell 56 and allows shadow soft logic 28 to be driven by either outputs 38 from the general-purpose routing 24 or by certain outputs of the hard logic block 22 using dedicated connections 52 when the shadow soft logic 28 is used to implement supplementary functionality.

These dedicated connections 44, 46 and 52 have some special features. Unlike connections through the general-purpose routing 24 and 26 which can reach any logic input, the dedicated connections 44, 46 and 52 can drive only particular logic inputs needed to implement the specific supplementary functionality required for use with the hard logic block 22. Specifically, dedicated connections 44 and 46 drive only selected inputs of the hard logic block 22, and dedicated connections 52 drive only selected inputs of soft logic 28 or 30 via multiplexers 50 or 48, respectively. Second, while connections through the general-purpose routing 24 and 26 can be routed in various ways entailing various lengthy and somewhat unpredictable delays, the dedicated connections 44, 46 and 52 have specific, known delays. This is advantageous as it enables that the supplementary functionality can be implemented in shadow soft logic 28 or soft logic 30 and yet still operate at the speed necessary to keep up with the associated hard logic block 22 that provides the basic functionality.

Like the shadow multiplexer 34, routing multiplexers 48 and 50 have select inputs controlled by programmable memory cells (54 and 56, respectively) that are programmed at the time the user circuit is programmed into the integrated circuit containing the architecture 20. The select inputs to routing multiplexers 48 and 50 are set as follows. If the soft logic 30 (or shadow soft logic 28) is to be used to provide supplementary functionality in conjunction with the hard logic block, and if that case requires signals from the hard logic block 22, the programmable memory cell 54 (or 56) is programmed to set routing multiplexer 48 (or 50) so as to select the relevant dedicated connections on line 52 from the hard logic block 22. Otherwise the programmable memory cell 54 (or 56) is programmed to set routing multiplexer 48 (or 50) so as to select the connections 58 (or 38) from the general-purpose routing 24.

Persons of ordinary skill in the art will appreciate that the lines shown interconnecting the various elements of architecture 20 represent multiple conductors and are shown as a single line for convenience. The number of individual conductors that make up each of the lines will be determined as a matter of design choice at the time the integrated circuit incorporating architecture 20 is designed.

The routing multiplexers 48 and 50 are shown as separate entities in FIG. 2. However they may be implemented in any functionally equivalent manner. For instance, routing multiplexer 48 could be replaced by enlarging the routing multiplexers (not shown) within the general-purpose routing 24 that drive connections 58 to include additional inputs from dedicated connections 52.

Some of the connections and circuitry shown may not be required in particular situations. For instance, either the shadow soft logic 28 or other soft logic 30 may be omitted if not required. Either or both of routing multiplexers 48 and 50 may be omitted if not required. The dedicated connections 44 and 46 or connection 32 (the direct connection between the output of hard logic block 22 and the general-purpose routing 26) may be omitted if not required. These are only examples, not meant to be limiting.

The concepts shown here in the context of math blocks may also be applied to other types of hard logic blocks used in FPGAs, such as state machines, memory interfaces, data buffering and processing logic, without limitation. They could also be used to add supplementary logic to be used with hard memory blocks, such as block select logic or multiplexing of read data signals.

Figure 3:
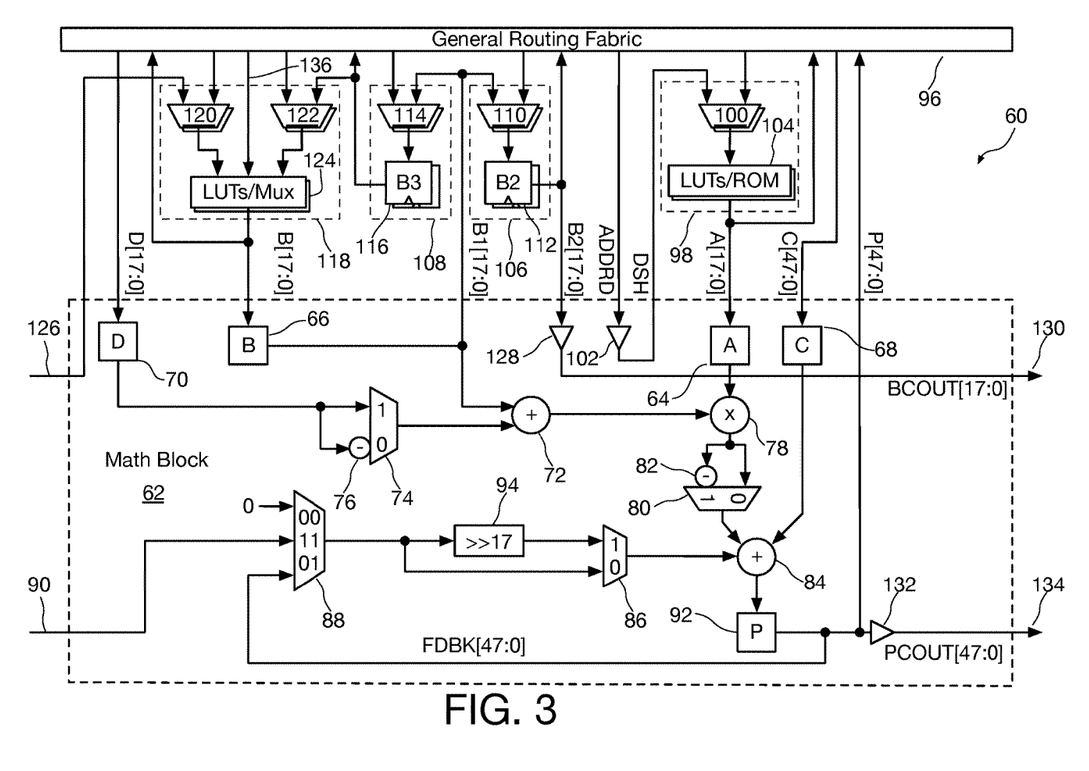
FIG. 3 is a block diagram showing an illustrative example of a math block for use in an FPGA coupled to shared input routing resources and shared output routing resources using soft logic in accordance with one aspect of the present invention.

Referring now to FIG. 3, a block diagram depicts a particular non-limiting example of an architecture 60 in accordance with the present invention. Architecture 60 includes math block 62 as an example of a hard logic block. Math block 62 includes the circuitry within the dashed-line rectangle.

Math block 62 is representative of the kind of math block or other hard logic function block that may be included in an architecture in accordance with the present invention. Persons of ordinary skill in the art will understand that the configuration of math block 62 is supplied for purposes of illustration and should not be taken as a limiting example of hard logic function blocks that may be utilized in the present invention.

Math block 62 includes an A register 64, a B register 66, a C register 68, and a D register 70. An adder 72 is driven by the output of the B register 66 and the output of the D register 70, which can be supplied to the adder 72 through a multiplexer 74 either directly or negated by a unit 76 that multiplies by −1 the value obtained from the D register 70. The output of the adder 72 can be multiplied with the contents of the A register 64 by a multiplier 78.

The output of multiplier 78, is provided through a multiplexer 80 either directly or negated by a unit 82 that multiplies by −1 the value obtained from the multiplier 78, to be summed by an adder 84 with the contents of the C register 68 and an operand supplied by a multiplexer 86. Multiplexer 86 is driven by the output of a multiplexer 88 which selects between 0, an operand supplied to the math block 62 on lines 90 provided to the math block 62 from a prior math block in a chain, or the output of a P register 92 driven by the adder 84. The operand supplied by the multiplexer 88 to the multiplexer 86 can be supplied to multiplexer 86 shifted by a number of bits (e.g., 17) by a shift register 94, and multiplexer 86 may pass either the direct output of multiplexer 88 or the shifted output supplied by the shift register 94.

The inputs to the C register 68 and the D register 70 are sourced from a general routing fabric 96. The inputs to the A register 64 are provided by soft logic 98 including multiplexers 100 that select from input provided by the general routing fabric 96 or the output of an address provided by the general routing fabric 96 and buffered by a buffer 102 inside math block 62. The output of multiplexers 100 drives a set of LUTs 104, which are capable of implementing a read-only memory (ROM), the output of which supplies the data to the A register 64 and is also returned to the general routing fabric 96.

In addition to being provided to adder 72, the outputs of the B register 66 are directed to soft logic 106 and soft logic 108. Soft logic 106 includes multiplexer 110 that selects between the outputs of the B register 66 and data from the general routing fabric 96. Multiplexer 110 drives B2 registers 112. Soft logic 108 includes a multiplexer 114 that selects between the outputs of the B register 66 and data from the general routing fabric 96. Multiplexer 114 drives B3 registers 116.

The inputs to the B registers 66 are supplied by soft logic 118 including multiplexers 120 and 122 and LUTs 124, which are capable of implementing a two-input multiplexer. Multiplexers 120 select between data sourced by the general routing fabric 96 and an input on lines 126 supplied to the math block 62 from a prior math block in a chain. Multiplexers 122 select between data sourced by the general routing fabric 96 and the outputs of the B3 registers 116. Multiplexers 120 and 122 drive LUTs/multiplexer 124. The output of LUTs/multiplexer 124 provides the inputs to the B registers 66 and are further provided to the general routing fabric 96.

The output of the B2 registers 112 is buffered by a buffer 128 and passed out of math block 62 on lines 130 as a BCOUT[17:0] signal to a next math block in a chain. The output of the P registers 92 is provided to the general routing fabric 96 and is further buffered by a buffer 132 in math block 62 and passed out of math block 62 on lines 134 as a PCOUT [47:0] signal to a next math block in a chain.

Soft logic blocks 98, 106, 108, and 118 are implemented with programmable (or "soft") logic comprised of look-up-tables (LUTs), flip-flops, and programmable routing multiplexers. The math block 62 is implemented with "hard" logic that is not programmable.

Persons of ordinary skill in the art will observe that the outputs of the soft logic blocks 98, 106, 108, and 118 are all returned to the general routing fabric 96. Because of this connectivity, advantageously the soft logic blocks 98, 106, 108, and 118 can also be used for general purposes when they are not used in conjunction with the rest of the math block 62.

According to one aspect of the present invention, the soft logic blocks 98, 106, 108, and 118 used in conjunction with the math block 62 have a fixed relative placement to the hard logic in the math block 62. This arrangement makes it possible to use dedicated connections among them.

Several special-purpose dedicated connections may be provided. Connections may be made from a hard block output to a particular soft logic block via a particular routing multiplexer. An example is the connection from the B registers 66 to the B2 registers 112 or the B3 registers 116 which are made via routing multiplexers 110 and 114, respectively. Note that such outputs can only reach the relevant one of soft logic blocks 98, 106, 108 and 118 and not other soft logic blocks.

Dedicated connections may be made from a particular soft logic block to a particular hard block input. An example is the connection from the LUTs implementing the ROM 104 to the inputs of the A registers 64 in the math hard block 62. Note that such hard block inputs are driven from the relevant soft logic block and cannot be driven (at least not directly) from other soft logic via the general routing fabric. For example, the only way to drive the inputs of the A register 64 from other soft logic via the general routing fabric would be indirectly, by programming the LUTs 104 to pass through one of its inputs to its output.

Dedicated connections may also be made from one soft logic block used as part of the math block to another via a particular routing multiplexer. An example is the connection from the B3 registers 116 to the LUTs 124 that can be used to implement a two-input multiplexer via routing multiplexer 122. Of course the usual connections between the hard math block and the general-purpose programmable routing may also be present.

The addition of dedicated connections among the math block 62 and the soft logic blocks 98, 106, 108 and 118 in architecture 60 allows for more flexible and efficient use of math block 62. It enables supplementary functions to be supported using existing soft logic without requiring additional hard logic that will cost extra area and power but only be used in certain cases. The soft logic blocks 98, 106, 108 and 118 are especially suitable for portions of the math functionality that need not be the fastest possible, and/or must be very flexible.

Because the connections are dedicated, with a repeatable pattern and independent of the general routing fabric 96, the speed of the combined hard/soft function of architecture 60 is predictable and unaffected by how the rest of the programmable logic and routing is configured. Also since the dedicated connections are short they are relatively fast and consume a minimum of power compared to ordinary programmable routing. This is especially important because signals to, within and from the math block 62 usually toggle at high frequencies, as is typically required for digital signal processing (DSP) functions or other math applications.

The dedicated connections also conserve scarce and expensive general programmable routing resources, which would otherwise be required when implementing math functions. (A particular example is given below.)

Some further details are provided describing how the soft logic blocks 98, 106, 108, and 118 may be used in conjunction with the math block 62 in accordance with the present invention. The illustrative non-limiting examples provided herein relate to the implementation of finite impulse response (FIR) filters, a common application for FPGA math blocks. An FIR filter must multiply T pairs of numbers, where one number is taken from an incoming stream of data values and the other number is one of T constant coefficients. The number T is referred to as the number of taps.

In a typical FIR filter implementation with T math blocks, the incoming data value stream is sent through a shift register chain and each math block taps the chain at a different point to obtain the necessary data value. For a simple parallel FIR, there is one register between adjacent math blocks. For a systolic FIR, there are two registers between adjacent math blocks for a total of 2T registers. For a parallel FIR, there are no registers between the math blocks; the same data value is sent to all T math blocks. The B registers in the math block 62 in conjunction with the B2 register 112 in soft logic 106 can be used to implement any of these alternatives. (Note that the soft flip-flops of the B2 register 112 can be configured to be transparent, so signals pass through them asynchronously, if that stage of latency is not required.) For example, if it is desired to provide two registers between adjacent math blocks, the FPGA can be configured to use the path from B register 66 to B2 register 112 to BCOUT on line 130 to the next math block, through its multiplexer 120 and LUTs 124 and to its B register 66. Since all connections remain within the math block and are dedicated minimal-length wires, power is minimized. In this case the use of slower soft logic does not impose a speed penalty because the register chain is never in the critical timing path.

As mentioned above, the LUTs 124 may be used to implement a 2:1 multiplexer. In certain cases it is possible to have an FIR where the shift register chain operates at half the frequency of the math blocks, a major power savings. However this requires that the math block be able to select one of two adjacent values from the shift register chain, on alternate clock cycles. The LUTs 124 in the soft logic 118 can be used to implement the 2:1 multiplexer (in the case shown, selecting between BCOUT of the previous math block, received on line 126, and B3 of the same math block). All the high-speed connections remain short and internal to the math block. An additional connection 136 from the general routing fabric 96 to the LUTs 124 can provide the select signal when the LUTs 124 implement the 2:1 multiplexer.

As mentioned above, the 18 N-input LUTs 104 may be used to provide an 18-bit wide ROM with 2N words. A simple implementation of a T-tap filter may use T math blocks, one for each tap. Alternatively, a "folded" implementation may be used where T/F math blocks are each responsible to compute F products. Since each product requires a different coefficient, F coefficient values must be provided to each math block. Provided F is less than the number of words that can be stored in the ROM 104, the ROM 104 is ideal for this purpose. An additional benefit is that the number of incoming signals that must be routed to the math block is reduced by 18–N, since instead of 18 bit coefficients it is only necessary to supply an N bit address. The address may be received directly from the general routing fabric 96 or through buffer 102 distributing an address bit in parallel to all 18 LUTs, or a combination of the two. This saves routing capacity and power.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An architecture in a user-programmable integrated circuit comprising:
    a hard logic block having inputs and outputs;
    a first group of user-configurable general-purpose routing resources coupled to first selected ones of the inputs of the hard logic block;
    a soft logic block having inputs and outputs, first selected ones of the inputs of the soft logic block coupled to the first group of user-configurable general-purpose routing resources, first selected ones of the outputs of the soft logic block having dedicated connections to second selected ones of the inputs to the hard logic block;
    a second group of user-configurable general-purpose routing resources selectively coupled to one of second selected ones of the outputs of the soft logic block and first selected ones of the outputs of the hard logic block; and
    second selected ones of the outputs of the hard logic block different from the first selected ones of the outputs of the hard logic block coupled to the second group of user-configurable general-purpose routing resources.

2. The architecture of claim 1 wherein second selected ones of the inputs of the soft logic block are selectively coupled to one of the first group of user-configurable general-purpose routing resources and second selected ones of the outputs of the hard logic block.

3. The architecture of claim 2 wherein the second selected ones of the inputs of the soft logic block are selectively coupled to the one of the first group of user-configurable general-purpose routing resources and the second selected ones of the outputs of the hard logic block through a routing multiplexer having a select input driven by a programmable memory cell.

4. An architecture in a user-programmable integrated circuit comprising:
    a hard logic block having inputs and outputs;
    a first group of user-configurable general-purpose routing resources coupled to first selected ones of the inputs of the hard logic block;

a shadow soft logic block having inputs and outputs, first selected ones of the inputs of the shadow soft logic coupled to the first group of user-configurable general-purpose routing resources and to the first selected ones of the inputs of the hard logic block, first selected ones of the outputs of the shadow soft logic block coupled to second selected ones of the inputs to the hard logic block;

a second group of user-configurable general-purpose routing resources directly coupled to first selected ones of the outputs of the hard logic block; and a shadow multiplexer having first data inputs, second data inputs, a select input, and data outputs, the first data inputs of the shadow multiplexer coupled to second selected ones of the outputs of the shadow soft logic block, the second data inputs of the shadow multiplexer coupled to second selected ones of the outputs of the hard logic block, the data outputs of the shadow multiplexer connected to the second group user-configurable general-purpose routing resources, and the select input of the shadow multiplexer driven by a programmable memory cell.

5. The architecture of claim 4 wherein second selected ones of the inputs of the shadow soft logic block are selectively coupled to one of the first group of user-configurable general-purpose routing resources and third selected ones of the outputs of the hard logic block.

6. The architecture of claim 5 wherein the second selected ones of the inputs of the shadow soft logic block are selectively coupled to the one of the first group of user-configurable general-purpose routing resources and the third selected ones of the outputs of the hard logic block through a routing multiplexer having a select input driven by a programmable memory cell.

7. The architecture of claim 4, further comprising:

a soft logic block having inputs and outputs, first selected ones of the inputs of the soft logic block coupled to the first group of user-configurable general-purpose routing resources, first selected ones of the outputs of the soft logic block having dedicated connections to third selected ones of the inputs to the hard logic block; and wherein second selected ones of the outputs of the soft logic block are coupled to the second group of user-configurable general-purpose routing resources.

8. The architecture of claim 7 wherein second ones of the inputs of the soft logic block are selectively coupled to one of the first group of user-configurable general-purpose routing resources and by dedicated connections to the third selected outputs of the hard logic block.

9. The architecture of claim 8 wherein the second ones of the inputs of the soft logic block are selectively coupled to the one of the first group of user-configurable general-purpose routing resources and by the dedicated connections to the third selected outputs of the hard logic block through a routing multiplexer having a select input driven by a programmable memory cell.

* * * * *